(12) United States Patent
Cheng et al.

(10) Patent No.: US 10,585,516 B2
(45) Date of Patent: Mar. 10, 2020

(54) OLED TOUCH CONTROL DRIVE CIRCUIT, METHOD, AND TOUCH CONTROL PANEL

(71) Applicant: BOE TECHNOLOGY GROUP CO., LTD., Beijing (CN)

(72) Inventors: Chih Jen Cheng, Beijing (CN); Xiaoliang Ding, Beijing (CN); Changfeng Li, Beijing (CN); Pengpeng Wang, Beijing (CN); Wei Liu, Beijing (CN); Yanling Han, Beijing (CN); Xueyou Cao, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/313,398

(22) PCT Filed: Mar. 20, 2018

(86) PCT No.: PCT/CN2018/079669
§ 371 (c)(1),
(2) Date: Dec. 26, 2018

(87) PCT Pub. No.: WO2018/219021
PCT Pub. Date: Dec. 6, 2018

(65) Prior Publication Data
US 2019/0163307 A1    May 30, 2019

(30) Foreign Application Priority Data

Jun. 1, 2017   (CN) .......................... 2017 1 0403869

(51) Int. Cl.
*G06F 3/041*   (2006.01)
*G09G 3/3233*  (2016.01)
(Continued)

(52) U.S. Cl.
CPC ............ *G06F 3/0412* (2013.01); *G06F 3/044* (2013.01); *G06F 3/04184* (2019.05);
(Continued)

(58) Field of Classification Search
CPC .... G06F 3/041; G06F 3/0412; G06F 3/04184; G06F 3/044; G09G 3/3208;
(Continued)

(56) References Cited

U.S. PATENT DOCUMENTS 9,236,011 B2    1/2016  Mizukoshi
9,672,770 B2 *  6/2017  Yang .................... G09G 3/3233
(Continued)

FOREIGN PATENT DOCUMENTS

CN    101587939 A    11/2009
CN    102346997 A     2/2012
(Continued)

OTHER PUBLICATIONS

International Search Report and Written Opinion dated Jun. 7, 2018, from application No. PCT/CN2018/079669.

*Primary Examiner* — Joe H Cheng
(74) *Attorney, Agent, or Firm* — Foley & Lardner LLP

(57) ABSTRACT

The present disclosure relates to a touch driving circuit. The touch driving circuit may include a driving transistor. A control terminal of the driving transistor is configured to receive a data signal. A first terminal of the driving transistor is configured to receive a power signal. A second terminal of the driving transistor is connected to a first electrode of a light emitting element in the touch panel. The touch driving circuit may include a touch electrode configured to transmit a touch signal. The touch electrode forms parasitic capacitance with a second electrode of the light emitting element. The touch driving circuit may include a control unit configured to transmit a compensation signal to the second
(Continued)

terminal of the driving transistor in response to a control signal. The power signal, the data signal, the touch signal, and the compensation signal are synchronously modulated signals during a touch stage.

11 Claims, 2 Drawing Sheets

(51) Int. Cl.
    *G06F 3/044*     (2006.01)
    *H01L 27/32*     (2006.01)
    *G09G 3/3258*     (2016.01)

(52) U.S. Cl.
    CPC .......... *G09G 3/3233* (2013.01); *G09G 3/3258* (2013.01); *H01L 27/323* (2013.01); *G09G 2300/0426* (2013.01); *G09G 2300/0819* (2013.01); *G09G 2300/0842* (2013.01); *G09G 2354/00* (2013.01)

(58) Field of Classification Search
    CPC ............ G09G 3/3233; G09G 3/3258; G09G 2300/0819; G09G 2300/0842; G09G 2354/00; H01L 27/323
    See application file for complete search history.

(56) References Cited

U.S. PATENT DOCUMENTS

| | | | |
|---|---|---|---|
| 9,905,164 B2 | 2/2018 | Mizukoshi | |
| 9,978,312 B2 * | 5/2018 | Yang | G06F 3/0416 |
| 10,115,345 B2 * | 10/2018 | Wang | G09G 3/3208 |
| 10,139,958 B2 * | 11/2018 | Ding | G09G 3/32 |
| 10,262,597 B2 * | 4/2019 | Yang | G06F 3/007 |
| 2011/0102403 A1 * | 5/2011 | Kim | G09G 3/3233 345/211 |
| 2013/0050292 A1 | 2/2013 | Mizukoshi | |
| 2015/0193045 A1 * | 7/2015 | Zhou | G09G 3/3233 345/174 |
| 2015/0294626 A1 * | 10/2015 | Bi | G09G 3/3233 345/211 |
| 2016/0086539 A1 | 3/2016 | Mizukoshi | |
| 2016/0204166 A1 * | 7/2016 | Yang | H01L 27/323 345/173 |
| 2016/0246409 A1 * | 8/2016 | Yang | G06F 3/0412 |
| 2016/0266702 A1 * | 9/2016 | Yang | G09G 3/3241 |
| 2016/0274692 A1 * | 9/2016 | Yang | G06F 3/044 |
| 2017/0038898 A1 | 2/2017 | Kim et al. | |
| 2017/0069264 A1 * | 3/2017 | Dai | G09G 3/3233 |
| 2017/0124941 A1 * | 5/2017 | Na | G09G 3/2092 |
| 2017/0153759 A1 | 6/2017 | Ding et al. | |
| 2017/0269783 A1 * | 9/2017 | Yang | G06F 3/0412 |
| 2018/0059855 A1 * | 3/2018 | Gwon | G06F 3/0412 |

FOREIGN PATENT DOCUMENTS

| | | |
|---|---|---|
| CN | 102968954 A | 3/2013 |
| CN | 102346997 B | 7/2014 |
| CN | 104835454 A | 8/2015 |
| CN | 106448558 A | 2/2017 |
| CN | 107016960 A | 8/2017 |
| EP | 3 128 401 A2 | 2/2017 |
| EP | 3 306 600 A1 | 4/2018 |
| JP | 2005-235496 A | 9/2005 |

* cited by examiner

OLED TOUCH CONTROL DRIVE CIRCUIT, METHOD, AND TOUCH CONTROL PANEL

CROSS REFERENCE

This application is a national stage of PCT/CN2018/079669, filed on Mar. 20, 2018, which is based upon and claims priority to Chinese Patent Application No. 201710403869.4, filed on Jun. 1, 2017, and the entire contents thereof are incorporated herein by reference.

TECHNICAL FIELD

The present disclosure relates to display technologies, and particularly to an OLED touch driving circuit and method, and a display panel.

BACKGROUND

With the development of self-luminous display technologies, Organic Light Emitting Diode (OLED) displays have gradually replaced traditional Liquid Crystal Displays LCDs) with its advantages of low energy consumption, low cost, wide viewing angle, and fast response speed. At present, the application of self-capacitive in-cell touch technology in LCD has been very mature. However, since the touch electrode is realized by the common electrode layer, a parasitic capacitance is formed between the gate lines and the data lines connected to the thin film transistors (TFTs), and the resulting capacitive load is large. Thus, there is proposed technique in related arts for eliminating load capacitance by applying a synchronous voltage to the common electrode line, gate lines, and data lines. However, for existing OLED devices, when the synchronous voltage is applied, the actual brightness of the OLED device may deviate from the expected brightness.

It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, there is provided a touch driving circuit for driving a touch panel. The touch driving circuit includes a driving transistor having a control terminal, a first terminal and a second terminal. The control terminal of the driving transistor is configured to receive a data signal. The first terminal of the driving transistor is configured to receive a power signal. The second terminal of the driving transistor is connected to a first electrode of a light emitting element in the touch panel. The touch driving circuit includes a touch electrode configured to transmit a touch signal. The touch electrode forms parasitic capacitance with a second electrode of the light emitting element. The touch driving circuit includes a control unit connected to the second terminal of the driving transistor. The control unit is configured to transmit a compensation signal to the second terminal of the driving transistor in response to a control signal.

The power signal, the data signal, the touch signal, and the compensation signal are synchronously modulated signals during a touch stage.

According to another aspect of the present disclosure, there is provided a touch driving method for driving a touch panel by using the touch driving circuit described above.

The touch driving method includes in a touch stage, transmitting by the touch electrode the touch signal. The method includes transmitting, by the control unit, the compensation signal to the second terminal of the driving transistor in response to the control signal. The method includes outputting, by the driving transistor, a driving current under action of the power signal in response to the data signal so as to drive the light emitting element to emit light. The power signal, the data signal, the touch signal, and the compensation signal are output as synchronously modulated signals.

According to another aspect of the present disclosure, there is provided an OLED touch panel including the touch driving circuit as described above.

BRIEF DESCRIPTION OF THE DRAWINGS

The accompanying drawings, which are incorporated in the specification and constitute a part of the specification, show exemplary arrangements of the present disclosure. The drawings along with the specification explain the principles of the present disclosure. It is apparent that the drawings in the following description show only some of the arrangements of the present disclosure, and other drawings may be obtained by those skilled in the art without departing from the drawings described herein.

DETAILED DESCRIPTION

Figure 1:
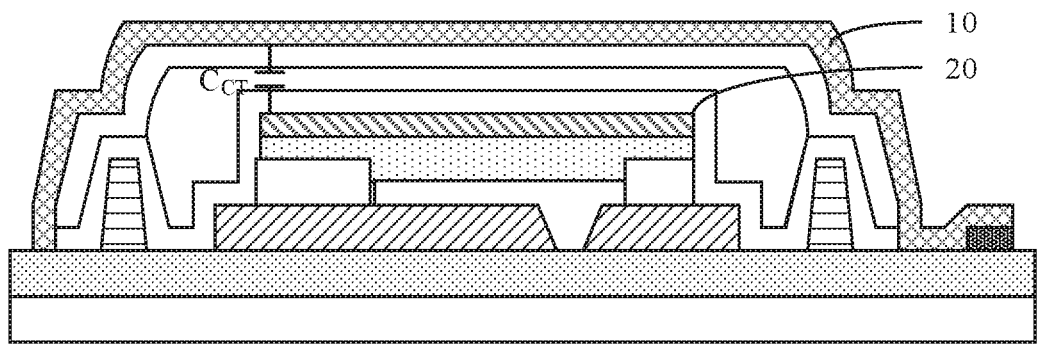
FIG. 1 is a schematic diagram showing a self-capacitive OLED touch panel in related arts.

Exemplary arrangements will now be described more fully with reference to accompanying drawings. However, the exemplary arrangements can be embodied in a variety of forms and should not be construed as being limited to the examples set forth herein; rather, these arrangements are provided to make this disclosure more complete, and convey the idea of the present disclosure to those skilled in the art. The described features, structures, or characteristics may be combined in any suitable manner in one or more arrangements.

In addition, the drawings are merely schematic representations of the present disclosure and are not necessarily drawn to scale. The same reference numbers in the drawings denote the same or similar parts, and the repeated descriptions thereof will be omitted. Some of the block diagrams shown in the figures are functional entities and do not necessarily correspond to physically or logically separate entities. These functional entities may be implemented in software, or implemented in one or more hardware modules or integrated circuits, or implemented in different networks and/or processor devices and/or microcontroller devices.

Figure 2:
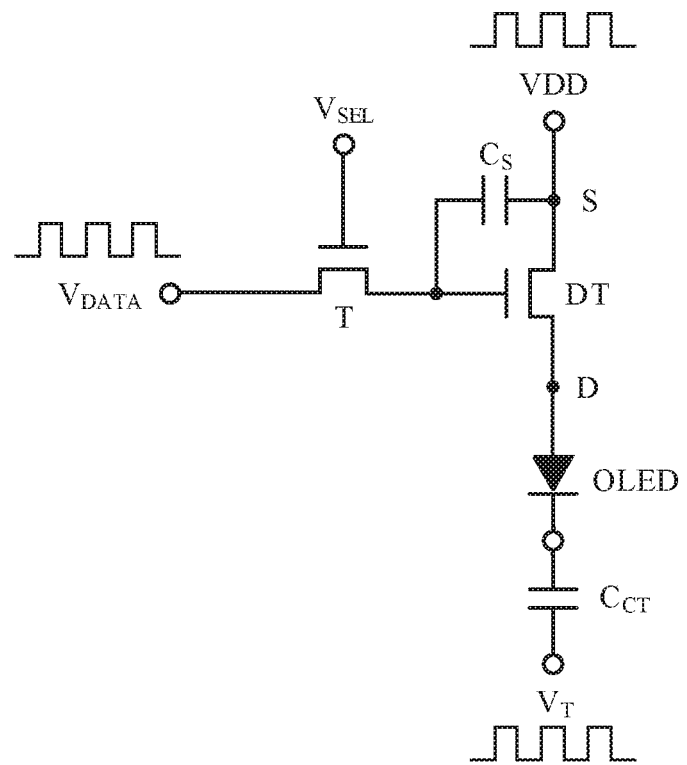
FIG. 2 is a schematic diagram showing an equivalent circuit of the OLED touch panel shown in FIG. 1.

When the self-capacitive in-cell touch technology is applied to an OLED display, the implementation is as shown in FIG. 1. A metal layer is deposited on a thin film encapsulation layer to form a touch electrode 10 in the non-display portion of the display area (TX&RX). For the equivalent circuit, reference may be made to FIG. 2, in which a control transistor T and a driving transistor DT and a storage capacitor $C_S$ may constitute a conventional 2T1C OLED driving circuit. On the basis of this, in order to reduce the load between the touch electrode 10 and the electrode (such as the cathode 20)/wiring of the OLED substrate, such as the parasitic capacitance $C_{CT}$, the synchronous voltage modulation method described above can be used to eliminate the load capacitance, that is, a data signal $V_{DATA}$ connected to the source of the control transistor T, a power signal VDD connected to the source of the driving transistor DT, and the touch signal $V_T$ are applied with synchronous voltages. However, the OLED is a current-driven device, and the modulation method causes the voltages of the source S and the drain D of the driving transistor DT to be out of sync, thus causing a difference $V_{DS}$ in source and drain voltages of the driving transistor DT which may cause the driving current to change. Consequently, the actual light emitting brightness of the OLED may deviate from the expected brightness.

Figure 3:
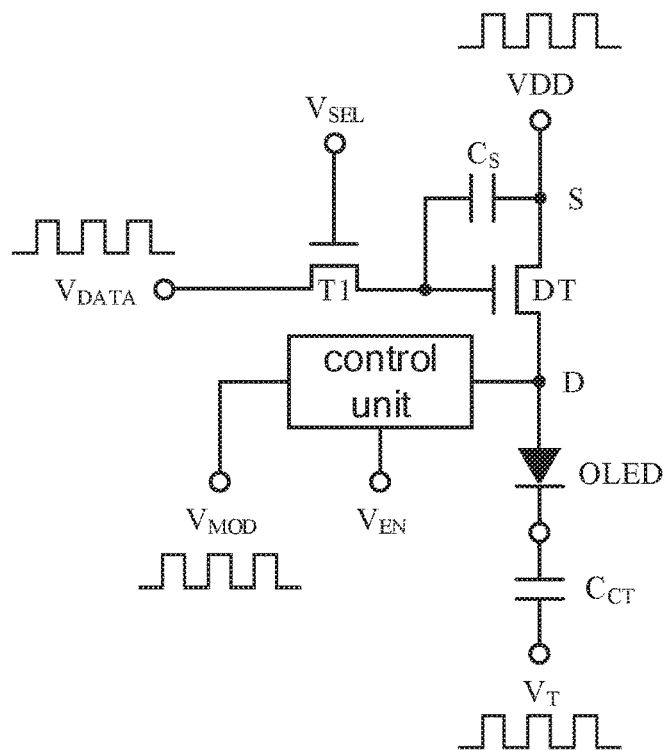
FIG. 3 is a schematic structural diagram of an OLED touch driving circuit according to at least one exemplary arrangement of the present disclosure.

At least one exemplary arrangement of the present disclosure provides an OLED touch driving circuit. As shown in FIG. 3, the touch driving circuit may include a driving transistor DT, a touch electrode TX&RX, a first transistor T1, and a control unit.

The driving transistor DT has a control terminal, a first terminal and a second terminal. The control terminal is configured to receive the data signal $V_{DATA}$, the first terminal is configured to receive the power signal VDD, and the second terminal is connected to a light emitting element which is an OLED in this arrangement, and is configured to transmit the power signal VDD to the first electrode of the OLED in response to the data signal $V_{DATA}$.

The touch electrode TX&RX is connected to a touch signal terminal and is configured to transmit the touch signal $V_T$.

The OLED has a first electrode and a second electrode. The first electrode is connected to the second terminal of the driving transistor DT, and the second electrode and the touch electrode (TX&RX) form a parasitic capacitance $C_{CT}$. The OLED emits light under the action of the output current from the driving transistor DT (i.e., the driving current of the OLED).

The first transistor T1 has a control terminal, a first terminal and a second terminal. The control terminal of the first transistor T1 is configured to receive a scan signal $V_{SEL}$, the first terminal of the first transistor T1 is configured to receive a data signal $V_{DATA}$, and the second terminal of the first transistor T1 is connected to the control terminal of the driving transistor DT. The first transistor T1 is configured to transmit the data signal $V_{DATA}$ to the control terminal of the driving transistor DT in response to the scan signal $V_{SEL}$.

The control unit is connected to a control signal terminal, a compensation signal terminal, and the second terminal of the driving transistor DT, and is configured to transmit a compensation signal $V_{MOD}$ to the second terminal of the driving transistor DT in response to a control signal $V_{EN}$.

The power signal VDD, the data signal $V_{DATA}$, the touch signal $V_T$, and the compensation signal $V_{MOD}$ are synchronously modulated signals during a touch stage.

In the touch stage, in order to ensure that the synchronously modulated signal(s) can be accurately applied to respective terminals or electrodes of the driving transistor DT and the OLED, the first transistor T1 and the control unit are in a normally-on state. This can be achieved by controlling the potentials of the scanning signal $V_{SEL}$ and the control signal $V_{EN}$.

It should be noted that the control terminal of the driving transistor DT is configured to receive the data signal $V_{DATA}$, but it is not directly connected to the data signal terminal, but is configured to receive the data signal $V_{DATA}$ through the first transistor T1.

In the OLED touch driving circuit provided by the exemplary arrangement of the present disclosure, by applying the synchronously modulated signals to the power signal VDD, the data signal $V_{DATA}$, the touch signal $V_T$, and the compensation signal $V_{MOD}$ during the touch stage, the parasitic capacitance $C_{CT}$ generated between the touch electrode (TX&RX) and the second electrode of the OLED can be eliminated, and the changes in the voltages of the source S and the drain D of the driving transistor DT can be synchronous, so that the source-drain voltage difference $V_{DS}$ of the driving transistor DT remain unchanged, thus avoiding the change of the driving current of the OLED caused by the change of the $V_{DS}$, and ensuring that the light emitting brightness of the OLED does not deviate from the expected light emitting brightness. Accordingly, the display quality can be ensured.

Based on the above description, the synchronously modulated signals may be signals with the same frequencies, the same phases, and the same modulation voltages; that is, the synchronously modulated signals are voltage signals that are completely consistent with each other. The synchronously modulated signals are beneficial for maintaining the consistency in the voltage variation at each terminal of the driving transistor DT.

Figure 4:
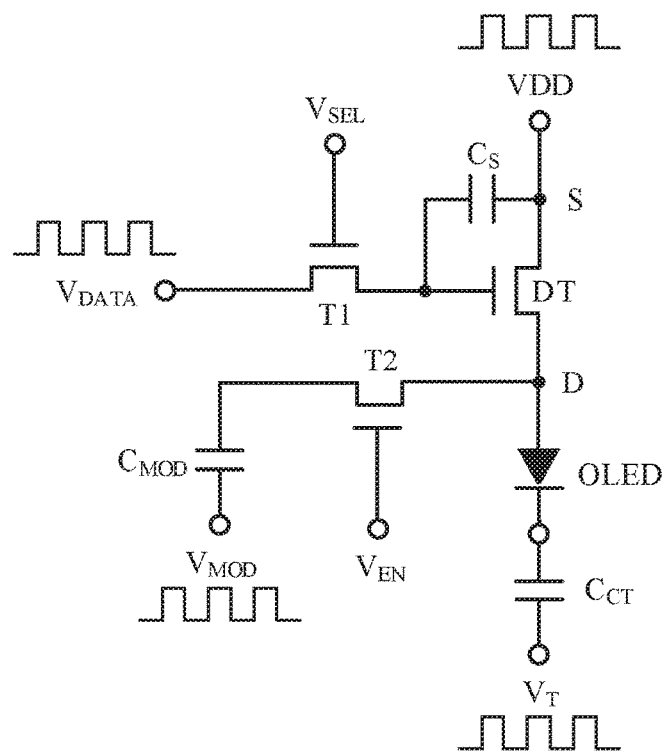
FIG. 4 is a schematic structural diagram of an OLED touch driving circuit according to at least one exemplary arrangement of the present disclosure.

Referring to FIG. 4, the control unit may include a second transistor T2 and a modulation capacitor $C_{MOD}$.

The second transistor T2 has a control terminal, a first terminal and a second terminal. The control terminal of the second transistor T2 is configured to receive the control signal $V_{EN}$, the first terminal second transistor T2 is connected to the modulation capacitor $C_{MOD}$, and the second terminal second transistor T2 is connected to the second terminal of the driving transistor DT.

The modulation capacitor $C_{MOD}$ has a first electrode and a second electrode, the first electrode is configured to receive the compensation signal $V_{MOD}$, and the second electrode is connected to the first terminal of the second transistor T2.

The compensation signal $V_{MOD}$ can be transmitted to the first terminal of the second transistor T2 through the modulation capacitor $C_{MOD}$, and the second transistor T2 can transmit the compensation signal $V_{MOD}$ to the second terminal of the driving transistor DT in response to the control signal $V_{EN}$.

The OLED touch driving circuit provided by the exemplary arrangement can be used to eliminate the parasitic capacitance between the touch electrode (TX&RX) inside the OLED touch panel and the electrodes/wirings of the OLED substrate. The touch electrode (TX&RX) may include driving electrodes TX and sensing electrodes RX, and the driving electrodes TX and the sensing electrodes RX may be located in the same layer, but the present disclosure is not limited to this.

It should be noted that the OLED touch panel in arrangements of the present disclosure may be a self-capacitive touch panel or a mutual-capacitive touch panel. Any OLED touch panel in which there is parasitic capacitance between the touch electrodes and the electrodes/lines of the OLED substrate and the parasitic capacitance can be eliminated by the method in the present exemplary arrangement, fall within the protection scope of the present disclosure.

According to at least one exemplary arrangement, the first electrode of the OLED may be an anode, and the second electrode may be a cathode. The anode may be made of materials such as be Indium Tin Oxide (ITO), and the cathode may be made of materials such as metal or an alloy. Alternatively, the first electrode of the OLED may be a cathode, and the second electrode of the OLED may be an anode, and the present disclosure does not impose specific limitations on this.

According to at least one exemplary arrangement, all transistors may be P-type transistors or N-type transistors. This arrangement can simplify the manufacturing processes by unifying the types of transistors. Specifically, all of the transistors may be MOS (Metal Oxide Semiconductor) field effect transistors, all of which may be P-type MOS transistors or N-type MOS transistors. It should be noted that for different transistor types, the level signals of respective signal terminals need corresponding adjustments.

In the present exemplary arrangement, in order to ensure that the OLED can normally emit light during the display stage, a storage capacitor $C_S$ for holding the voltage of the control terminal of the driving transistor DT may be provided. The storage capacitor $C_S$ may be disposed between the control terminal and the first terminal of the driving transistor DT, or may be disposed between the control terminal and the second terminal of the driving transistor DT, and the specific arrangement of the storage capacitor can be adjusted according to the connection manner of the OLED electrode and the driving transistor DT.

The working procedure of the OLED touch driving circuit provided by the exemplary arrangement is described in detail below with reference to FIG. 4.

In a display stage, the first transistor T1 is turned on in response to the scan signal $V_{SEL}$ to transmit the data signal $V_{DATA}$ to the control terminal of the driving transistor DT and charge the storage capacitor $C_S$. The driving transistor DT is turned on in response to the data signal $V_{DATA}$ received by the control terminal of the driving transistor DT, and outputs the driving current under the action of the power signal VDD, so as to control the OLED to emit light.

In a touch stage, the touch electrode (TX&RX) receives the touch signal $V_T$ and senses a touch operation to generate a sensing signal. The second transistor T2 is turned on in response to the control signal $V_{EN}$ to make the modulation capacitor $C_{MOD}$ and the drain D of the driving transistor DT D have the same potential. When modulation is performed to eliminate capacitance, both the first transistor T1 and the second transistor T2 are turned on, the data signal $V_{DATA}$ is applied to the control terminal of the driving transistor DT, the power signal VDD is applied to the first terminal of the driving transistor DT, the compensation signal $V_{MOD}$ is applied to the second terminal of the driving transistor DT (i.e., the first electrode of the OLED) through the modulation capacitor $C_{MOD}$, and the touch signal $V_T$ is applied to the touch electrode. The power signal VDD, the data signal $V_{DATA}$, the touch signal $V_T$ and the compensation signal $V_{MOD}$ are applied with synchronous voltage signals which have the same frequencies, phases and voltages, so that changes in the voltages at respective terminals (the control terminal, the first terminal and the second terminal) of the driving transistor DT and the electrodes (the first electrode and the second electrode) of the OLED keep consistent, thus eliminating the parasitic capacitance $C_{CT}$ generated between the touch electrode (TX&RX) and the second electrode of the OLED, while ensuring that the difference $V_{DS}$ between the source and drain voltages of the driving transistor DT is relatively constant. Consequently, the present disclosure can avoid a change in the driving current of the OLED light emitting element and ensure that light emitting brightness of the OLED is not affected.

At least one exemplary arrangement of the present disclosure further provides an OLED touch panel, including the touch driving circuit described above. In such an arrangement, the touch panel can further include a plurality of scan lines configured to provide scan signals $V_{SEL}$, a plurality of data lines configured to provide data signals $V_{DATA}$, and a touch unit configured to transmit a touch driving signal and receive the touch sensing signal.

In at least one exemplary arrangement, the touch panel can be used to form a display device. The display device may include any product or component having a display function, such as a mobile phone, a tablet computer, a television, a notebook computer, a digital photo frame, a navigator, and the like.

It should be noted that although modules or units of devices for executing functions are described above, such division of modules or units is not mandatory. In fact, features and functions of two or more of the modules or units described above may be embodied in one module or unit in accordance with the arrangements of the present disclosure. Alternatively, the features and functions of one module or unit described above may be further divided into multiple modules or units.

In addition, although various blocks of the method of the present disclosure are described in a particular order in the figures, this is not required or implied that the blocks must be performed in the specific order, or all the blocks shown must be performed to achieve the desired result. Additionally or alternatively, certain blocks may be omitted, multiple blocks may be combined into one block, and/or one block may be decomposed into multiple blocks and so on.

Through the description of the above arrangements, those skilled in the art will readily understand that the exemplary arrangements described herein may be implemented by software or by a combination of software with necessary hardware. Therefore, the technical solutions according to arrangements of the present disclosure may be embodied in the form of a software product, which may be stored in a non-volatile storage medium (which may be a CD-ROM, a USB flash drive, a mobile hard disk, etc.) or on a network. A number of instructions are included to cause a computing device (which may be a personal computer, server, mobile terminal, or network device, etc.) to perform the methods in accordance with the arrangements of the present disclosure.

Other arrangements of the present disclosure will be apparent to those skilled in the art. The present application is intended to cover any variations, uses, or adaptations of the present disclosure, which are in accordance with the general principles of the present disclosure and include common general knowledge or conventional technical means in the art that are not disclosed in the present disclosure. The specification and arrangements are illustrative, and the real scope and spirit of the present disclosure is defined by the appended claims.

What is claimed is:

1. A touch driving circuit for driving a touch panel, comprising:

a driving transistor having a control terminal, a first terminal and a second terminal, wherein the control terminal of the driving transistor is configured to receive a data signal, the first terminal of the driving transistor is configured to receive a power signal, and the second terminal of the driving transistor is connected to a first electrode of a light emitting element in the touch panel;

a touch electrode configured to transmit a touch signal, wherein the touch electrode forms parasitic capacitance with a second electrode of the light emitting element;

a control unit connected to the second terminal of the driving transistor, and configured to transmit a compensation signal to the second terminal of the driving transistor in response to a control signal;

wherein the power signal, the data signal, the touch signal, and the compensation signal are synchronously modulated signals during a touch stage.

2. The touch driving circuit of claim 1, wherein the touch driving circuit further comprises:

a first transistor having a control terminal, a first terminal and a second terminal, wherein the control terminal of the first transistor is configured to receive a scan signal, the first terminal of the first transistor is configured to receive the data signal, and the second terminal of the first transistor is connected to the control terminal of the driving transistor.

3. The touch driving circuit of claim 2, wherein the first transistor and the driving transistor are P-type transistors or N-type transistors.

4. The touch driving circuit of claim 1, wherein the control unit comprises:

a second transistor having a control terminal, a first terminal and a second terminal, wherein the control terminal of the second transistor is configured to receive the control signal, and the second terminal of the second transistor is connected to the second terminal of the driving transistor; and a modulation capacitor having a first electrode and a second electrode, wherein the first electrode of the modulation capacitor is configured to receive the compensation signal, and the second electrode of the modulation capacitor is connected to the first terminal of the second transistor.

5. The touch driving circuit of claim 1, wherein respective modulation voltages of the synchronously modulated signals are the same.

6. The touch driving circuit of claim 1, wherein the touch driving circuit further comprises:

a storage capacitor connected between the control terminal and the first terminal of the driving transistor.

7. The touch driving circuit of claim 1, wherein the light emitting element is an Organic Light Emitting Diode (OLED).

8. A method for driving a touch panel by using a touch driving circuit, wherein the touch driving circuit comprises:

a driving transistor having a control terminal, a first terminal and a second terminal, wherein the control terminal of the driving transistor is configured to receive a data signal, the first terminal of the driving transistor is configured to receive a power signal, and the second terminal of the driving transistor is connected to a first electrode of a light emitting element in the touch panel, a touch electrode configured to transmit a touch signal, wherein the touch electrode forms parasitic capacitance with a second electrode of the light emitting element;

a control unit connected to the second terminal of the driving transistor, and configured to transmit a compensation signal to the second terminal of the driving transistor in response to a control signal;

wherein the method comprises:

in a touch stage, transmitting by the touch electrode the touch signal;

transmitting, by the control unit, the compensation signal to the second terminal of the driving transistor in response to the control signal;

outputting, by the driving transistor, a driving current under action of the power signal in response to the data signal so as to drive the light emitting element to emit light;

wherein the power signal, the data signal, the touch signal, and the compensation signal are output as synchronously modulated signals.

9. The method of claim 8, wherein modulation voltages of the synchronously modulated signals are the same.

10. An OLED touch panel, comprising the touch driving circuit according to claim 1.

11. The touch panel of claim 10, wherein the touch panel comprises:

a plurality of scan lines configured to provide scan signals;

a plurality of data lines configured to provide data signals; and a touch unit configured to transmit a touch driving signal and receive a touch sensing signal.

* * * * *